US012807037B2

(12) United States Patent
Zeyher et al.

(10) Patent No.: US 12,807,037 B2
(45) Date of Patent: Nov. 24, 2026

(54) THERMAL CIRCUIT FOR A THERMAL MANAGEMENT SYSTEM OF AN ELECTRIFIED VEHICLE

(71) Applicant: Dr. Ing. h.c. F. Porsche Aktiengesellschaft, Stuttgart (DE)

(72) Inventors: Fabian Zeyher, Stuttgart (DE); Marcel Dannowski, Bietigheim-Bissingen (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 370 days.

(21) Appl. No.: 18/453,382

(22) Filed: Aug. 22, 2023

(65) Prior Publication Data

US 2024/0067047 A1 Feb. 29, 2024

(30) Foreign Application Priority Data

Aug. 26, 2022 (DE) ..................... 10 2022 121 618.7

(51) Int. Cl.
*B60L 58/24* (2019.01)
*B60H 1/00* (2006.01)
(Continued)

(52) U.S. Cl.
CPC ........... *B60L 58/24* (2019.02); *H01M 10/486* (2013.01); *H01M 10/613* (2015.04);
(Continued)

(58) Field of Classification Search
CPC ... B60L 58/24; H01M 10/486; H01M 10/613; H01M 10/615; H01M 10/625;
(Continued)

(56) References Cited

U.S. PATENT DOCUMENTS 9,744,827 B2 8/2017 Nishikawa et al.
9,827,824 B2 11/2017 Enomoto et al.
(Continued)

FOREIGN PATENT DOCUMENTS

CN 102941791 A 2/2013
CN 111231774 A 6/2020
(Continued)

*Primary Examiner* — Steve S Tanenbaum
(74) *Attorney, Agent, or Firm* — LEYDIG, VOIT & MAYER, LTD.

(57) ABSTRACT

A thermal circuit having a main conveying direction for a thermal management system of an electrified vehicle, the thermal circuit including a main circuit with a main circuit first conduit portion having a first pump and a heat exchanger provided behind the first pump and a main circuit second conduit portion. The thermal circuit includes a partial circuit with a partial circuit first conduit portion having a second pump and a component arranged to be temperature-controlled behind the second pump and a partial circuit second conduit portion. The thermal circuit further includes a connecting valve connected to the main circuit first conduit portion or the partial circuit first conduit portion and the main circuit second conduit portion or the partial circuit second conduit portion for controlling a volume flow. The thermal circuit includes a first fluid connection connected to the connecting valve, and a second fluid connection.

20 Claims, 2 Drawing Sheets

(51) Int. Cl.

| | |
|---|---|
| ***B60H 1/14*** | (2006.01) |
| ***B60K 11/02*** | (2006.01) |
| ***H01M 10/48*** | (2006.01) |
| ***H01M 10/613*** | (2014.01) |
| ***H01M 10/615*** | (2014.01) |
| ***H01M 10/625*** | (2014.01) |
| ***H01M 10/63*** | (2014.01) |
| ***H01M 10/6568*** | (2014.01) |
| ***H05K 7/20*** | (2006.01) |

(52) U.S. Cl.

CPC ....... *H01M 10/615* (2015.04); *H01M 10/625* (2015.04); *H01M 10/63* (2015.04); *H01M 10/6568* (2015.04); *H05K 7/20881* (2013.01); *B60H 1/00278* (2013.01); *B60H 2001/00307* (2013.01); *B60H 1/143* (2013.01); *B60K 11/02* (2013.01); *H01M 2220/20* (2013.01)

(58) Field of Classification Search

CPC .............. H01M 10/63; H01M 10/6568; B60H 1/00278; B60H 1/00885

USPC .......................................................... 165/294

See application file for complete search history.

(56) References Cited

U.S. PATENT DOCUMENTS

| | | | | |
|---|---|---|---|---|
| 2020/0303791 | A1* | 9/2020 | Choi | .................. H01M 10/625 |
| 2021/0309069 | A1 | 10/2021 | Kim | |

FOREIGN PATENT DOCUMENTS

| | | | |
|---|---|---|---|
| CN | 111532104 | A | 8/2020 |
| CN | 211808933 | U | 10/2020 |
| EP | 3763556 | A1 | 1/2021 |
| JP | 2003267065 | A | 9/2003 |
| JP | 2013119259 | A | 6/2013 |
| JP | 2014043181 | A | 3/2014 |
| JP | 2014218237 | A | 11/2014 |
| JP | 2022079328 | A | 5/2022 |
| KR | 102021123571 | A | 10/2021 |

* cited by examiner

THERMAL CIRCUIT FOR A THERMAL MANAGEMENT SYSTEM OF AN ELECTRIFIED VEHICLE

CROSS REFERENCE TO RELATED APPLICATIONS

This application claims benefit to German Patent Application No. DE 10 2022 121 618.7, filed on Aug. 26, 2022, which is hereby incorporated by reference herein.

FIELD

The invention relates to a thermal circuit having a main conveying direction for a thermal management system of an electrified vehicle, a method for operating a thermal circuit, a thermal management system having such a thermal circuit for an electrified vehicle, and an electrified vehicle having such a thermal management system comprising a thermal management system.

BACKGROUND

From the prior art, thermal circuits for thermal management systems for electrified vehicles are known. Due to the high efficiency of the electrical components, significantly less waste heat is generated in electrified vehicles compared to components from conventional combustion engine-powered vehicles. In addition, the temperature ranges in which the components can be operated are significantly smaller compared to the components from combustion engine-powered vehicles, which is why the functional requirements for thermal circuits have increased significantly. Due to the high efficiency, not enough heat energy from waste heat is available for the temperature control of the passenger cabin in cold ambient temperatures. This lack of thermal energy is therefore generated using electric heaters or heat pumps powered by electrical energy from a high voltage battery.

The problem here is that this reduces the range of the electrified vehicle.

SUMMARY

In an embodiment, the present disclosure provides a thermal circuit having a main conveying direction for a thermal management system of an electrified vehicle, the thermal circuit comprising a main circuit comprising a main circuit first conduit portion having a first pump and a heat exchanger provided behind the first pump and a main circuit second conduit portion. The thermal circuit further comprises a partial circuit comprising a partial circuit first conduit portion having a second pump and a component arranged to be temperature-controlled behind the second pump and a partial circuit second conduit portion. The thermal circuit further comprises a connecting valve connected to the main circuit first conduit portion or the partial circuit first conduit portion and the main circuit second conduit portion or the partial circuit second conduit portion for controlling a volume flow. The thermal circuit further comprises a first fluid connection connected to the connecting valve, and a second fluid connection. The first and second fluid connections are respectively connected to the main circuit first conduit portion, the partial circuit first conduit portion, the main circuit second conduit portion, and the partial circuit second conduit portion.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
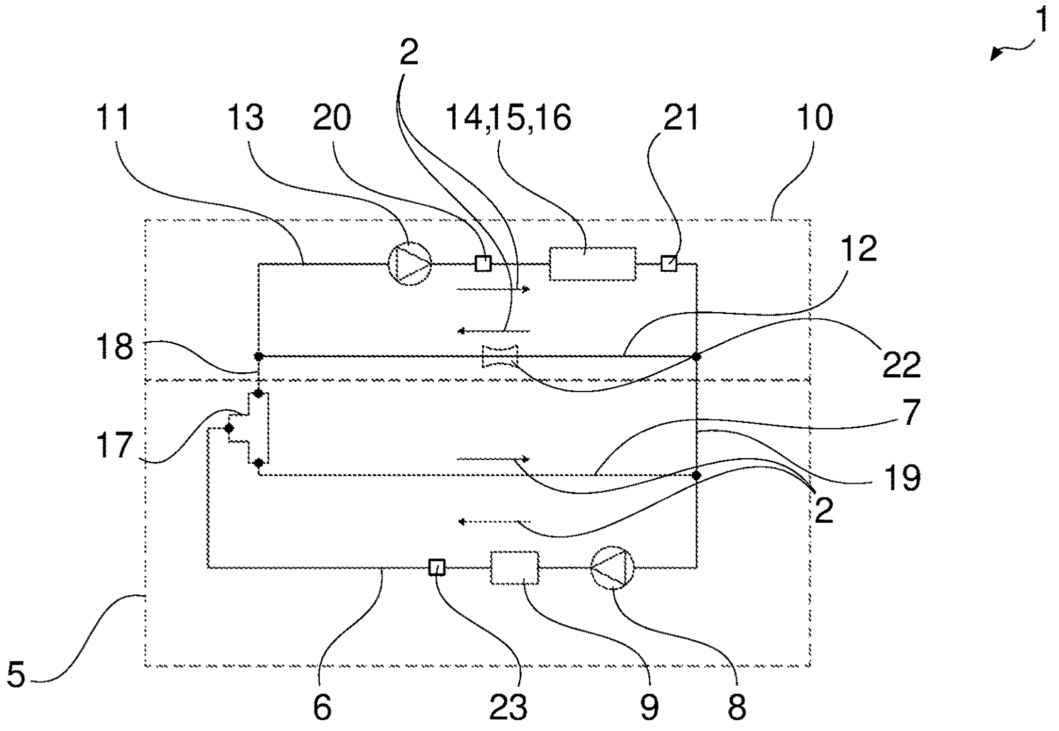
FIG. 1 illustrates a thermal circuit in a schematic diagram.

Embodiments of the present invention at least partially overcome the disadvantages known from the prior art. The features of embodiments of the present invention can be combined in any technically meaningful manner, wherein the explanations from the following description as well as features from the figures, which comprise supplementary configurations of the invention, can also be used for this purpose.

In an embodiment, the invention relates to a thermal circuit having a main conveying direction for a thermal management system of an electrified vehicle, wherein the thermal circuit comprises at least:

- a main circuit comprising a first conduit portion having a first pump and a heat exchanger located behind the first pump and a second conduit portion;
- a partial circuit comprising a first conduit portion having a second pump and a component to be temperature-controlled rearward of the second pump and a second conduit portion;
- a connecting valve connected to the first conduit portion and the second conduit portion of the main circuit or the partial circuit for controlling a volume flow;
- a first fluid connection connected to the connecting valve; and
- a second fluid connection, wherein the fluid connections are respectively connected to both the first conduit portion and the second conduit portion of both the main circuit and the partial circuit.

Ordinal numbers used in the description above and below are used only for clear differentiation and do not reflect any order or ranking of the designated components, unless explicitly indicated otherwise. An ordinal number greater than one does not necessitate that a further such component must necessarily be present.

The thermal circuit disclosed here is set up to allocate heat to the component that requires the heat (or cold). In this case, the temperature distribution or the stored heat quantity can be homogenized in the partial circuit via the respective component (for example, a high voltage battery or an electric drive machine) without further heat input or cold input from the (then separated) main circuit. In addition, with the connecting valve as a mixing valve, when temperature control is required in the component of the partial circuit to be temperature controlled, the heat or cold of the main circuit is not necessarily transferred abruptly into the partial circuit, but preferably gradually, thereby avoiding a temperature shock and/or a large inhomogeneity of the temperature distribution in the component to be temperature-controlled. The operation is explained in further detail below.

The thermal circuit disclosed here serves to convey a temperature control fluid, which is a coolant, for example; such as an oil or water-glycol mixture. Using the temperature control fluid, the components of the electrified vehicle to be temperature-controlled can be temperature-controlled, wherein both heating of the component to be temperature-controlled and cooling of the component to be temperature-controlled is to be understood by temperature control.

It should be noted that the component to be temperature-controlled can be formed from a plurality of different components, which will be explained in further detail below.

In an embodiment, the electrified vehicle is a hybrid (e.g., electric and combustion engine, for example) driven vehicle. Alternatively, the electrified vehicle is a purely electrically driven vehicle.

The thermal circuit according to the present definition is divided into a main circuit and a partial circuit. Both the partial circuit and the main circuit each comprise a pump. Such a pump comprises, for example, a centrifugal pump or spindle pump. With the help of the pumps, the temperature control fluid is conveyable through the thermal circuit.

Both the main circuit and the partial circuit each comprise a first conduit portion and a second conduit portion. The respective first portion of the conduit has the respective pump. As a result, the two circuits of the thermal circuit with the respective pumps associated therewith are operable separately and independently from one another. The respective second conduit portion closes the respective circuit so that (preferably without further secondary circuits) a closed-circuit fluid circuit that can be operated in circulation is depicted.

It should be noted that in a preferred embodiment, a conduit portion comprises an assembly of different components that are connected to each other via conduit elements. In an embodiment, one conduit portion is a conduit element for connecting other conduit elements or other conduit portions.

The main delivery direction of the thermal circuit is determined by a main operating state of a pump, wherein the main delivery directions of the two pumps mentioned here are aligned in the same manner when the first conduit portions of the main circuit and the partial circuit are connected in series by means of the connecting valve and the fluid connections (compare below). Preferably, the pumps are then respectively arranged between the heat exchanger and the component to be temperature-controlled, wherein particularly preferably the heat exchanger is arranged on the pressure side of the first pump and the component to be temperature-controlled is arranged on the suction side of the first pump, and conversely the heat exchanger is arranged on the suction side of the second pump and the component to be temperature-controlled is arranged on the pressure side of the second pump. In an embodiment example, the orientation of the main conveying direction is unchangeable. In an embodiment, the orientation of the main conveying direction differs from what was previously described; for example, inverse and/or operable in an auxiliary operation, for example, inverse.

The heat exchanger comprises one or more heat exchangers. These heat exchangers are arranged to introduce heat output into the main circuit, thereby increasing the temperature of the temperature control fluid in the main circuit or discharging thermal energy from the main circuit, thereby decreasing the temperature of the temperature control fluid in the main circuit. For example, at least one of these heat exchangers is an air cooler by means of which heat is interchangeable with ambient air. In an embodiment, for example, at least one of the heat exchangers is an electric heater by means of which thermal energy is generated using electrical energy. In an embodiment, for example, at least one of the heat exchangers is a chemical and/or electrical radiator by means of which thermal energy is convertible into electrical energy. In an embodiment, at least one of the heat exchangers is a component that is mainly used for other purposes and is also suitable for absorbing and/or emitting heat, such as a drive unit or an (other) electrical component.

In a preferred embodiment, the connecting valve comprises a housing with three connection nozzles and a valve body with a corresponding valve seat. By means of the valve body and the corresponding valve seat, the opening cross-sections of the respective connecting nozzles can be blocked and unblocked in the housing, in an embodiment exclusively (at least in the respective end state) respectively completely, and in an embodiment controllably, i.e. so that they are partially closed, for setting a volume flow; namely over a volume flow range that is limited by the two extreme positions, in a multi-stage or continuously variable manner. In an embodiment, a volume flow entering one of the connection nozzles (the inlet in this case) can be directed exclusively to one of the other two connection nozzles (the outlets in this case), wherein at least two of the connection nozzles can preferably be used (one after the other or simultaneously) as an inlet. In a preferred embodiment, a volume flow partition between two headers that are acting as outlets is adjustable. It should be noted that in another embodiment, the connecting valve has more or only two connection nozzles. It should also be noted that the valve body is also or exclusively configured, for example, for a translatory movement for adjusting a volume flow or flow direction.

The connecting valve preferably consists of an electrically controllable mixing valve. In another embodiment, the connecting valve is a temperature controlled connecting valve that regulates the volume flow by thermally expanding a control element that is included in the valve.

The fluid connections serve to connect the main circuit and the partial circuit. In a preferred embodiment example, the temperature control fluid flows from the main circuit into the partial circuit via the first fluid connection, and the temperature control fluid flows from the partial circuit back into the main circuit via the second fluid connection. In an embodiment, at least one of the fluid connections is a conduit element having a defined length. Alternatively, at least one of the fluid connections is a direct connection from the main circuit and the partial circuit, which therefore does not require a conduit element. In an embodiment, the first fluid connection is formed in one piece with the connecting valve, for example from one of the connection nozzles.

It is further suggested in an advantageous embodiment of the thermal circuit that at least one temperature sensor is provided in the partial circuit, both ahead of and behind the component to be temperature-controlled.

A temperature sensor is any type of sensor that outputs a first signal at a first temperature and a second signal at a second temperature. Via the signals and with the knowledge of which signal corresponds to which temperature, a temperature can be measured (usually indirectly). In this case, an indirect measurement is to be understood to signify that the temperature is not measured as a physical quantity itself. A physical auxiliary variable is measured, which in turn corresponds to a specific temperature. For example, such an auxiliary variable is a variable electrically stable resistance, electrical capacitance or volumetrically detectable thermal expansion.

In an embodiment, for example, at least one Ni—Cr—Ni temperature sensor [nickel-chromium-nickel] is utilized, which is energized by means of an electrical energy source, whereby an electrical resistance of this temperature sensor can be detected, which in turn corresponds to a temperature. In other embodiments, at least one of the temperature sensors is a sensor that alters its resistance, such as an NTC [negative temperature coefficient] sensor or a PTC [positive temperature coefficient] sensor, or any other electrically and/or electronically evaluable temperature sensors.

Due to the advantageous placement of the temperature sensors both ahead of and behind the component to be heated, a temperature difference can be determined via the component to be temperature-controlled. This temperature difference (as will be explained in further detail later) provides information about the operating point of the component to be temperature-controlled; furthermore, the second pump can be particularly advantageously controlled when the temperature difference is known.

It is furthermore disclosed in an advantageous embodiment of the thermal circuit that the second conduit portion of the partial circuit comprise a throttle device.

The throttle device can be specifically (adjustably or permanently), more specifically permanently, set via a geometric change in the conduit portion diameter to the pressure loss of the second conduit portion, in such a manner that the volume flow via the second conduit portion is adjustable or set as a function of the volume flow via a conduit portion running parallel thereto.

It is particularly advantageous when using a throttle device that the pressure loss of the second conduit portion can be influenced very easily regardless of the length and/or other geometric design of the second conduit portion, and can thus be determined very precisely, regardless of a specific design or installation situation or the skills of a worker. This influence on the pressure drop by using the throttle device is advantageously implemented by using an insertion throttle with a fixed or (preferably one-time) adjustable throttle action. This results in a high degree of flexibility and independence from other geometrical requirements for the first conduit portion and/or the second conduit portion.

It is furthermore disclosed in an advantageous embodiment of the thermal circuit that the heat exchanger comprise a radiator and/or a heater.

In an embodiment, the radiator comprises an air-coolant cooler through which a temperature control fluid (hereinafter referred to as the cooling agent) passes on one side (hereinafter referred to as the inner side), and through which air passes on a second side (hereinafter referred to as the outer side). As a result of a temperature difference prevailing between the inner side and outer side, heat is hereby absorbed from the colder medium, thereby cooling the warmer fluid, which constitutes the coolant in a cooling event. Using a radiator fan, air can be passed across the outside of the air-coolant cooler (actively by means of a radiator fan and/or passively by driving speed), thereby achieving a high rate of heat transfer from the coolant to the air.

In an embodiment, the radiator comprises a coolant-coolant cooler. In that case, the warmer coolant also releases heat to the colder coolant.

In an embodiment the radiator comprises a refrigerant-coolant cooler, for example a so-called chiller, which transfers heat between the refrigerant and coolant. A refrigerant is a fluid that in operation, at least in an extreme operating state, undergoes a phase transition between the liquid and gaseous forms, providing a significantly increased heat capacity. Both the coolant and the refrigerant are encapsulated from the surrounding environment by means of conduit routing.

In this case, the term heater refers to any component that introduces heat into the temperature control fluid. In an embodiment example, the heater comprises a PTC heater by means of which electrical energy is convertible into thermal energy. In an embodiment example, the heater comprises a heat pump by means of which heat from a refrigerant is released into the temperature control fluid. However, any component which releases heat into the temperature control fluid can also be understood to constitute a heater.

At some operating points, where—for example, in a coolant-air radiator—the air is warmer than the coolant, heat can also be absorbed from the air by the coolant at these particular operating points. A radiator is thereby also operable as a heater.

In an advantageous embodiment of the thermal circuit, it is furthermore disclosed that a third temperature sensor be provided behind the heat exchanger in the first conduit portion of the main circuit.

Using this third temperature sensor, it can be determined how much temperature control performance is added and/or released into the temperature control fluid via the heat exchanger. With the help of this temperature information, the temperature in the main circuit can be set via the heat exchanger, preferably directly adjustably with this third signal as the input variable. The embodiment of the third temperature sensor is executable analogously to the embodiments already described above for the first and second temperature sensors. Preferably, all temperature sensors are similar, especially preferably identical, for a high degree of reliability or a low differing susceptibility to interference variables.

In accordance with another aspect, a method of operating a thermal circuit according to an embodiment as per the above description is disclosed, wherein

- in a first state, the first conduit portion and the second conduit portion of the main circuit are exclusively fluidically connected by means of the connecting valve; and
- in a second state, the first conduit portion of the main circuit is exclusively fluidically connected to the partial circuit via the connecting valve, wherein, preferably in a third state, both the first conduit portion and the second conduit portion of the main circuit as well as the first conduit portion of the main circuit are fluidically connected via the first fluid connection to the partial circuit in order to produce a mixture of the fluid from the main circuit and the partial circuit.

In the first state, the entire amount of fluid conveyed by the first pump is directed from the first conduit portion of the main circuit into the second conduit portion of the main circuit. As a result, the temperature control fluid (that is conveyed by the first pump) flows exclusively through the main circuit. Since the first fluid connection is closed by the connecting valve in this first state, no temperature control fluid can flow through the second fluid connection between the main circuit and the partial circuit as well. With the aid of the heat exchanger, the temperature level of the temperature control fluid in the main circuit is advantageously adjustable in this first state. In this first state, the partial circuit is also closed within itself, whereby the second pump conveys an amount of fluid in a particularly advantageous manner, this amount being independent of the operation of the first pump.

In the second state, the second conduit portion of the main circuit is closed by the connecting valve. The complete temperature control fluid flows from the main circuit into the partial circuit as a result. In this second state, the first pump and the second pump are connected in series, whereby the flow rates of the first pump and the second pump supplement each other. Depending on the actuation of the second pump and the resulting pressure drop, the temperature control fluid delivered by the second pump flows either A) from the first conduit portion of the partial circuit through the second fluid connection into the first conduit portion of the main circuit, or B) through the second conduit portion of the partial circuit directly back into the first conduit portion of the partial circuit. The distribution ratio which is set between these two parallel flow paths is determined by the pressure drops of the respective conduit portions and by the actuation of the second pump. Alternatively or additionally, at least one further valve is provided on the input side and/or the output side of the second conduit portion of the partial circuit in order to close the second conduit portion of the partial circuit, or to restrict a flow through it.

In a preferred additionally possible third state, the connecting valve divides the volume flow of the temperature control fluid between the first fluid connection and the second conduit portion of the main circuit, depending on the position of the valve body of the connecting valve. By introducing the temperature control fluid that is at a first temperature level from the main circuit into the partial circuit that is at a second temperature level, the temperature of the temperature control fluid that flows into the component to be temperature-controlled is adjustable, and preferably also very accurately adjustable. This allows the thermal circuit to adjust the temperature control performance that is transferred to the component to be temperature-controlled independently of that which is adjusted by the volume flow of the temperature control fluid passing through the component to be temperature-controlled.

According to another aspect, a method of operating a thermal circuit is disclosed, wherein the thermal circuit comprises at least:

a partial circuit comprising a second pump for circulating a temperature control fluid, a component to be temperature-controlled, a first temperature sensor arranged upstream of the component to be temperature-controlled, as well as a second temperature sensor arranged downstream of the component to be temperature-controlled, wherein the method comprises at least the following steps that are performed by a processor to record, process, and output signals:

a. recording a first temperature signal that is dependent on a prevailing temperature at the first temperature sensor;
b. recording a second temperature signal that is dependent on a prevailing temperature at the second temperature sensor;
c. forming a comparison value based on the recorded first temperature signal and the recorded second temperature signal;
d. comparing the formed comparison value with a limit value;
e. setting a pump speed of the second pump to maintain this limit value.

In an advantageous embodiment, the processor is a control unit of a thermal circuit. Alternatively or additionally, the processor comprises multiple control units, for example a control unit of the thermal circuit and a control unit of the component to be temperature-controlled. The processor is configured to read in signals from sensors (or alternatively, to process prepared data), process those signals or corresponding processed data by using computational operations, and/or compare them to values from characteristic curves and/or maps. In an advantageous embodiment, the processor is also set up to issue control signals to components, such as a control signal for a pump or a control signal for a valve, preferably at least the connecting valve. This allows the processor to adjust the flow rate of the pump in question, or adjust the valve body in the connecting valve such that the partitioning of the flow corresponds to a specification.

Due to the particularly advantageous placement of the temperature sensors before and after the component to be temperature-controlled, a temperature difference between the temperature of the temperature control fluid (in the main conveying direction) before the applicable component and the temperature of the temperature control fluid (in the main conveying direction) behind the component to be temperature-controlled is calculated as a comparison value, for example. Using the temperature difference as well as the volume flow of the temperature control fluid (which is determinable via the pump control) through the component to be temperature-controlled, a temperature control performance of the component to be temperature-controlled can be calculated. This means that the amount of temperature control power that is transferred from the temperature control fluid into the component to be temperature-controlled can be calculated.

In this preferred embodiment, the second pump conveys the temperature control fluid exclusively through the partial circuit and thus through the component to be temperature-controlled.

Some of the components to be temperature-controlled are particularly advantageously operable when the temperature in the component to be temperature-controlled is particularly homogeneous. In order to achieve a homogeneous temperature in the component to be temperature-controlled, it is necessary to convey the temperature control fluid through the component to be temperature-controlled at a defined volume flow. This is particularly advantageous for especially large components, components with highly branched cooling channels, and/or components with an inhomogeneous temperature distribution (for example due to inhomogeneous utilization). By comparing the calculated temperature difference to a defined limit value, the method described here allows the second pump to be adjusted such that a volume flow rate of the temperature control fluid, which is always sufficient for a desired homogeneity, flows through the component to be temperature-controlled.

In an advantageous embodiment of the method, it is furthermore disclosed that the thermal circuit furthermore comprise:

a main circuit that can be connected to the partial circuit via fluid connections, comprising a heat exchanger and a first pump for circulating a temperature control fluid;

a connecting valve for controlling a volume flow via the fluid connections between the main circuit and the partial circuit, wherein the method comprises at least the following steps that are performed by a processor to record, process, and output signals:

f. obtaining and/or calculating a current temperature control request for the component to be temperature-controlled;
g. adjusting a valve position of the connecting valve to accommodate the volume flow for adapting the temperature level of the component to be temperature-controlled to the current temperature request.

In the preferred embodiment described, for example, the main circuit and the partial circuit are at different temperature levels. The temperature level of the main circuit or its volume flow is usually only or significantly controlled in dependence on a current requirement for temperature control.

As already described, the second pump ensures that the temperature distribution in the component to be temperature-controlled is (approximately, technically) homogeneous. At some operating points, it is possible that the component to be temperature-controlled is at a sufficiently homogeneous temperature, but is at a temperature level that is too high, for example. In this case, a temperature control request is generated.

Due to this temperature control request, the connecting valve can be controlled by the processor in a particularly advantageous manner, as will be explained by way of example in the following:

The connecting valve opens the connection via the first fluid connection from the main circuit to the partial circuit, whereby the temperature level of the partial circuit and the temperature level of the main circuit are adjusted. At an exemplary operating point, the temperature level of the main circuit is lower than the temperature level of the partial circuit. As a result of opening the fluid connections between the main circuit and the partial circuit, the temperature level of the partial circuit and thereby also the temperature level of the component to be temperature-controlled can be lowered at this operating point. This decrease in the temperature level within the partial circuit is controllable by means of the component to be temperature-controlled, regardless of the flow rate of the second pump. It is particularly advantageous hereby that the homogenization of the component to be temperature-controlled is thereby controllable, or preferably can be actuated, regardless of the temperature level of the component to be temperature-controlled.

It is further disclosed in an advantageous embodiment of the method that the heat exchanger comprise a radiator and/or a heater, wherein the radiator and/or the heater is controlled to reach the temperature level in accordance with the current temperature control request in order to actively introduce heat into the main circuit and/or release heat from the main circuit.

It should be noted that if there is a large difference between the present temperature level and the temperature level in accordance with the current temperature control request, the temperature level of the main circuit can be actively controlled by means of the heat exchanger. This is done either by controlling the radiator (for example, by a radiator fan) and thus lowering the temperature of the main circuit, or by controlling the heater by means of which heat can be introduced into the main circuit (i.e. is brought in), and thereby raising the temperature of the main circuit. With regard to possible embodiments of a radiator and/or heater, reference is made to the foregoing description in connection with the thermal circuit.

In an advantageous embodiment of the method, it is further disclosed that the component to be temperature-controlled be used for storing thermal energy.

In some application examples, the component to be temperature-controlled has a high thermal capacity. This means that a high amount of heat can be stored in the component to be heated. This quantity, also referred to as a specific heat capacity, describes the heat supplied or withdrawn to/from an amount of the substance (i.e., the component here), divided by the associated increase or decrease in the temperature and mass of the substance.

By storing the thermal energy, it can keep the component to be temperature-controlled at a temperature level for a certain period of time, so that the component to be heated is already at the correct temperature level in a possible subsequent continued operation. In another application case, it makes more sense for the thermal circuit to store the thermal energy than to discharge this thermal energy.

It is further disclosed in an advantageous embodiment of the method that the thermal energy stored in the component to be temperature-controlled be utilized for another component.

In this case it is particularly advantageous that (excess) heat (i.e., commonly referred to as waste heat) which is generated in the thermal circuit can be stored in the component to be temperature-controlled and, if necessary, removed from the component to be temperature-controlled again at another time and fed to another component. This, on the one hand, allows the very low heat dissipation performance of electrical components to be retained within the thermal circuit (and not to release it irrevocably to the environment) and provide this heat dissipation performance to another component, which (at another time) requires temperature control.

It is furthermore disclosed in an advantageous embodiment of the method that the component to be temperature-controlled be a high voltage battery and/or a chiller of an electrified vehicle.

If, for example, the component to be temperature-controlled is a high voltage battery, homogenization is particularly advantageous because a high voltage battery often consists of a plurality of battery cells, which can heat up differently during operation (for example, due to different access to cooling or different loads). The high voltage battery has a relatively small feel-good temperature range. This means that the high voltage battery can only be operated with particular efficiency and performance within a small temperature range. Advantageously, this feel-good temperature range is between 20° C. and 50° C. The feel-good temperature range is particularly advantageous between 25° C. and 35° C.

According to another aspect, often for internal battery regulation and/or fuse regulation, both the hottest and the coldest battery cell must be within this comfort temperature range to ensure the performance and efficiency of the high voltage battery. Homogenization of the high voltage battery is therefore of particular importance. This homogenization is ensured (as already described above) by a high volume flow of the temperature control fluid through the high voltage battery. In this case, by mingling the temperature control fluid from the main circuit, the temperature level of the high voltage battery can be adjusted or ensured by the high voltage battery, regardless of the volume flow of the temperature control fluid. The main circuit or its volume flow rate is usually controlled solely or predominantly in dependence on the temperature or a current need for temperature control. As a result of a precise, preferably continuously variable, adjustability of the connecting valve, it is also possible to ensure that the temperature level of the component to be temperature-controlled is changed with a low gradient. Preferably, the range of values of this gradient ranges from 1 K/min to 2 K/min. This is particularly advantageous for a long service life of the high voltage battery.

For example, if the component to be heated is a chiller, i.e. a thermal bridge to a cooling circuit, the thermal energy from the partial circuit can be transferred through the chiller to the cooling circuit. In most application cases, the cooling circuit has a further heat exchanger in addition to the chiller, which can be used for heating and/or cooling the vehicle cabin. This provides the possibility of transporting thermal energy from the temperature control fluid into a space, for example a vehicle cabin of a vehicle.

Due to the phase change of the refrigerant taking place in the chiller, it is preferably operated within a limited temperature range on the side of the temperature control fluid. In order to be able to adjust the temperature control performance independently of the temperature range of the temperature control fluid in the main circuit, an exact control of the mixing ratio of the temperature control fluid is particularly advantageous.

In an aspect, a thermal management system for an electrified vehicle is disclosed, comprising at least one thermal circuit according to one embodiment according to the above description, wherein the thermal circuit furthermore preferably comprises at least one further partial circuit, wherein at least one of the further partial circuits is preferably arranged; for example, the partial circuit of the thermal circuit.

In a first embodiment example, this thermal management system shifts the thermal energy between a partial circuit and a main circuit, whereby only a minimum amount of thermal energy is always transferred to the main circuit, and the remaining thermal energy remains in the partial circuit.

In a second embodiment example, the preferred thermal management system allows the thermal energy to be discharged from a first partial circuit either in a main circuit and/or the thermal energy to be discharged in whole or in part into a second partial circuit to, for example, a component to be temperature-controlled.

In an embodiment example, this preferred thermal management system makes it possible to connect a main circuit and a first partial circuit, in which the component to be temperature-controlled is, for example, a high voltage battery and a further partial circuit, in which the component to be temperature-controlled is a chiller, with each other (in a manner that allows heat transfer to take place) to ensure a fully variable displacement of the thermal energy between these (preferably all) components and the main circuit of the thermal management system.

In an aspect, an electrified vehicle comprising a thermal management system according to an embodiment according to the above description is disclosed, and at least one of the following components:

a high voltage battery;

a chiller; and an electric drive unit;

wherein at least one of the components can be temperature-controlled by using the thermal management system, wherein the thermal energy of one of the components is preferably displaceable to another of the components by means of the thermal management system.

The displacement of thermal energy refers to any form of heat transport here. In this case, a first component emits the thermal energy which is reabsorbed by a second component. This reduces the temperature of the first component and increases the temperature of the second component.

In a preferred embodiment example—for example, in the main circuit of the thermal management system—an electric drive unit is arranged in addition to a radiator and/or a heater.

In an exemplary application case, thermal energy is available in the main circuit due to the waste heat from the drive unit. At the same time, there is a request for temperature control (for example, a temperature increase) from the high voltage battery and a request for temperature control (for example, a temperature increase) of a vehicle cabin of the vehicle, which can be supplied via the chiller. In this case, the thermal management system allows the thermal energy of the main circuit to be divided between the high voltage battery and the chiller in a particularly advantageous manner in line with needs. This ensures that thermal energy generated in the thermal management system can remain in the thermal management system as long as possible by either supplying the components with the desired temperature and/or storing it in, for example, the high voltage battery (with a high heat capacity). This reduces the need to generate thermal energy solely for the purpose of temperature control of individual components, thereby requiring less electrical energy, which in turn increases the range of the electrified vehicle.

In this thermal management system (also abbreviated as TMM), each component to be temperature-controlled and each component of the heat exchanger is preferably usable as a heat source and/or as a heat sink. In so doing, a heat source emits heat into the temperature control fluid, and a heat sink absorbs heat from the temperature control fluid.

Embodiments of the invention described above are explained in detail below with reference to the accompanying drawings, which show preferred configurations, in light of the relevant technical background. Embodiments of the invention are not limited in any way by the purely schematic drawings, wherein it is noted that the drawings are not true to size.

In FIG. 1, a thermal circuit 1 is shown in a schematic circuit diagram. The thermal circuit 1 can be divided into a main circuit 5 and a partial circuit 10. The partitioning into the main circuit 5 and the partial circuit 10 is shown in FIG. 1 using the dashed frames. The main conveying direction 2 is indicated by means of arrows in the main circuit 5 and in the partial circuit 10. The end and start of a respective conduit portion are marked by points. All temperature sensors 20,21,23 are represented by a filled square.

The main circuit 5 comprises a first pump 8, a heat exchanger 9 provided behind the first pump 8, and a third temperature sensor 23 provided behind the heat exchanger 9, wherein the direction is relative to the main conveying direction 2 of the thermal circuit 1. This part of the main circuit 5 is referred to as the first conduit portion 6.

A connecting valve 17 is placed behind the first conduit portion 6 of the main circuit 5. This connecting valve 17 has connections. These connections consist of one inlet and two outlets in this embodiment example. The first outlet of the connecting valve 17 is connected to the second conduit portion 7 of the main circuit 5. The second conduit portion 7 of the main circuit 5 closes this circuit through a connection to the first conduit portion 6. The second outlet of the connecting valve 17 connects the main circuit 5 to the partial circuit 10 via a first fluid connection 18.

The partial circuit 10 also comprises a first conduit portion 11 and a second conduit portion 12. This first conduit portion 11 comprises a second pump 13, a component 14,15,16 to be heated rearward of the second pump 13, and two temperature sensors 20,21. Herein the first temperature sensor 20 is provided directly in front of the component 14,15,16 to be temperature-controlled, and the second temperature sensor 21 is provided directly behind the component 14,15,16 to be temperature-controlled.

The end of the first conduit portion 11 of the partial circuit 10 is connected to both the second conduit portion 12 of the partial circuit 10 and the second fluid connection 19. The partial circuit 10 is closed via the connection of the first conduit portion 6 to the second conduit portion 7.

The fluid connections 18,19 in turn connect the main circuit 5 to the partial circuit 10. Using the connecting valve 17, a volume flow is either completely controllable on the first outlet (i.e., in the second conduit portion 7 of the main circuit 5), or completely controllable on the second outlet (i.e., in the first conduit portion 11 of the partial circuit 10). Furthermore, the volume flow between the first outlet and the second outlet can be partitioned by means of the connecting valve 17, i.e. between the second conduit portion 7 of the main circuit 5 and the first conduit portion 11 of the partial circuit 10.

In the embodiment shown, the second conduit portion 12 of the partial circuit 10 comprises (optionally) a throttle device 22.

Figure 2:
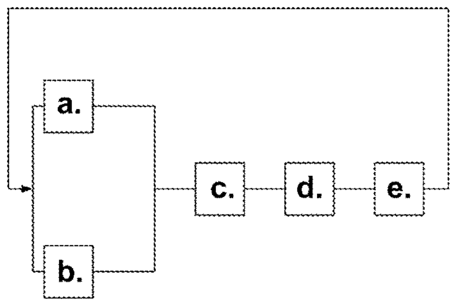
FIG. 2 schematically illustrates a first method for operating a thermal circuit.

In FIG. 2, a schematic representation of a first method of operating a thermal circuit 1 is shown, for example as shown in FIG. 1. The individual method steps are hereby indicated by lowercase letters in rectangular boxes. FIG. 2 shows that the method steps a. and b. take place in parallel, i.e. simultaneously with each other. Then, the method steps c., d. and e. take place in serial sequence, that is, consecutively over time. The result of the method step e. serves as the starting value for the method steps a. and b. This means that these method steps take place in a loop as indicated by the arrow shown.

Figure 3:
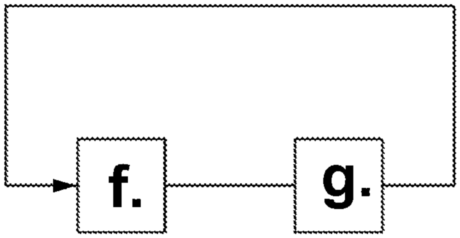
FIG. 3 schematically illustrates a second method for operating a thermal circuit.

In FIG. 3, a schematic diagram of a second method for operating a thermal circuit 1, for example as shown in FIG. 1, is shown with the method steps f. and g. Here, the method steps are carried out in serial sequence. The result from method step g. in turn serves as the starting value for the method step f.; that is, the method steps take place in a loop as indicated by the arrow. The method steps of FIG. 2 and the method steps of FIG. 3 proceed independently from each other. The method steps of FIG. 2 and the method steps of FIG. 3 can also proceed parallel to each other.

Figure 4:
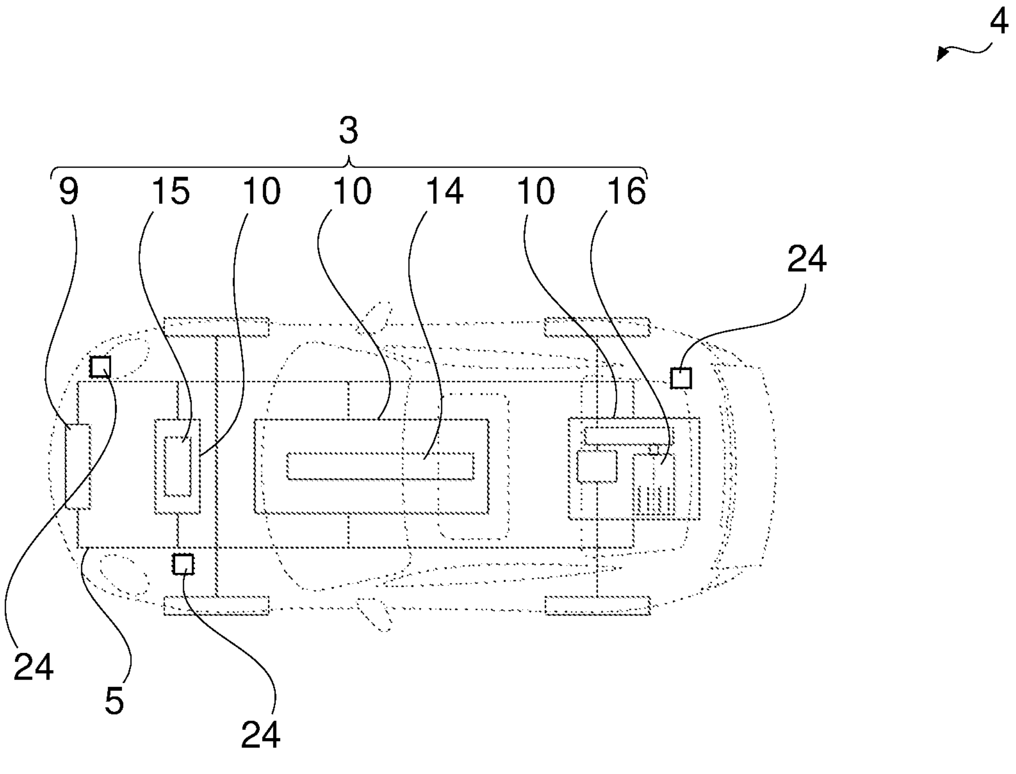
FIG. 4 illustrates an electrified vehicle having a thermal management system in a schematic top view.

In FIG. 4, an electrified vehicle 4 having a thermal management system 3 is shown in a schematic top view. The thermal management system 3 of the electrified vehicle 4 comprises:

a main circuit 5;

a chiller 15 located in a partial circuit 10;

a high voltage battery 14 located in a partial circuit 10; and an electric drive unit 16.

These circuits are interconnected such that the thermal energy of one component 14,15,16 and/or circuit is displaceable to another component 16,15,14 and/or circuit. The displacement of the thermal energy is controlled by one and/or more processors 24, wherein the processor(s) 24 process the temperature control requests actuating the pumps 8,13 and the connecting valve 17.

With the thermal circuit disclosed here and method for operating a thermal circuit, a temperature distribution is homogenizable in a component, and a main circuit is operable at a temperature-controlled volume flow.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

1 Thermal circuit
2 Main conveying direction
3 Thermal management system
4 Electrified vehicle
5 Main circuit
6 First conduit portion of the main circuit
7 Second conduit portion of the main circuit
8 First pump
9 Heat exchanger
10 Partial circuit
11 First conduit portion of the partial circuit
12 Second conduit portion of the partial circuit
13 Second pump
14 High-voltage battery
15 Chiller
16 Electric drive unit
17 Connecting valve
18 First fluid connection
19 Second fluid connection
20 First temperature sensor
21 Second temperature sensor
22 Throttle device
23 Third temperature sensor
24 Processor

The invention claimed is:

1. A thermal circuit having a main conveying direction for a thermal management system of an electrified vehicle, the thermal circuit comprising:

a main circuit comprising a main circuit first conduit portion having a first pump and a heat exchanger provided behind the first pump and a main circuit second conduit portion;

a partial circuit comprising a partial circuit first conduit portion having a second pump and a component arranged to be temperature-controlled behind the second pump and a partial circuit second conduit portion;

a connecting valve connected to the main circuit first conduit portion or the partial circuit first conduit portion and the main circuit second conduit portion or the partial circuit second conduit portion for controlling a volume flow;

a first fluid connection connected to the connecting valve; and a second fluid connection, wherein the first and second fluid connections are respectively connected to the main circuit first conduit portion, the partial circuit first conduit portion, the main circuit second conduit portion, and the partial circuit second conduit portion, wherein the connecting valve is configured to alternate between a first state and a second state, the first state causing a temperature control fluid to circulate the main circuit via the connecting valve and the second state causing the temperature control fluid to circulate continuously between the main circuit and the partial circuit through the connecting valve.

2. The thermal circuit according to claim 1, further comprising at least two temperature sensors arranged in the partial circuit, wherein a first temperature sensor of the at least two temperature sensors is arranged in front of the component to be temperature-controlled and a second temperature sensor of the at least two temperature sensors is arranged behind the component to be temperature-controlled.

3. The thermal circuit according to claim 1, wherein the partial circuit second conduit portion comprises a throttle.

4. The thermal circuit according to claim 1, wherein the heat exchanger comprises a radiator and/or a heater.

5. The thermal circuit according to claim 1, wherein, in the main circuit first conduit portion, a third temperature sensor is provided behind the heat exchanger.

6. The thermal circuit according to claim 1, wherein:

in the first state of the connecting valve, the main circuit first conduit portion and the main circuit second conduit portion are exclusively fluidically connected to each other by the connecting valve; and in the second state of the connecting valve, the main circuit first conduit portion is exclusively fluidically connected to the partial circuit via the first fluid connection.

7. A method of operating a thermal circuit having a main conveying direction for a thermal management system of an electrified vehicle, the thermal circuit comprising: a main circuit comprising a main circuit first conduit portion having a first pump and a heat exchanger provided behind the first pump and a main circuit second conduit portion; a partial circuit comprising a partial circuit first conduit portion having a second pump and a component arranged to be temperature-controlled behind the second pump and a partial circuit second conduit portion; a connecting valve connected to the main circuit first conduit portion or the partial circuit first conduit portion and the main circuit second conduit portion or the partial circuit second conduit portion for controlling a volume flow; a first fluid connection connected to the connecting valve; and a second fluid connection, wherein the first and second fluid connections are respectively connected to the main circuit first conduit portion, the partial circuit first conduit portion, the main circuit second conduit portion, and the partial circuit second conduit portion, and wherein the connecting valve is configured to alternate between a first state and a second state, the first state causing a temperature control fluid to circulate the main circuit via the connecting valve and the second state causing the temperature control fluid to circulate continuously between the main circuit and the partial circuit through the connecting valve, the method comprising:

in a first operating state, exclusively fluidically connecting the main circuit first conduit portion and the main circuit second conduit portion to each other by the connecting valve; and in a second operating state, exclusively fluidically connecting, by the connecting valve, the main circuit first conduit portion to the partial circuit via the first fluid connection.

8. A thermal management system for an electrified vehicle comprising at least one thermal circuit according to claim 1, wherein the at least one thermal circuit further comprises at least one further partial circuit.

9. An electrified vehicle comprising the thermal management system according to claim 8 and at least one of the following components:

a high voltage battery, a chiller, and an electric drive unit, and wherein at least one of the components can be temperature-controlled by the thermal management system.

10. The electrified vehicle according to claim 9, comprising at least two of the components, and wherein thermal energy of one of the components is displaceable by the thermal management system to another of the components.

11. A method of operating a thermal circuit, wherein the thermal circuit at least comprises:

a partial circuit comprising a pump for circulating a temperature control fluid, a component to be temperature-controlled, a first temperature sensor arranged in front of the component to be temperature-controlled, and a second temperature sensor arranged downstream of the component to be temperature-controlled, wherein the method is performed by a processor configured to record, process, and output signals, the method comprising:

a. sensing a first temperature signal that is dependent on a prevailing temperature at the first temperature sensor;

b. sensing a second temperature signal that is dependent on a prevailing temperature at the second temperature sensor;

c. forming a comparison value based on the recorded first temperature signal and the recorded second temperature signal;

d. comparing the formed comparison value with a limit value; and e. setting a pump speed of the pump to maintain the limit value.

12. The method according to claim 11, wherein the component to be temperature-controlled is a high voltage battery and/or a chiller of an electrified vehicle.

13. The method of claim 11, wherein the thermal circuit further comprises:

a main circuit that can be connected to the partial circuit via fluid connections, comprising a heat exchanger and a further pump for circulating a temperature control fluid;

a connecting valve for controlling a volume flow via the fluid connections between the main circuit and the partial circuit, wherein the method comprises:

f. obtaining and/or calculating a current temperature control request for the component to be temperature-controlled; and g. adjusting a valve position of the connecting valve to accommodate the volume flow to adapt the temperature level of the component to be temperature-controlled to the current temperature request.

14. The method of claim 13, wherein the heat exchanger comprises a radiator and/or a heater, and wherein the radiator and/or heater are controlled to achieve the temperature level in accordance with the current temperature control request in order to actively introduce heat into and/or discharge heat from the main circuit.

15. The method according to claim 11, wherein the component to be temperature-controlled stores thermal energy.

16. The method according to claim 15, wherein the thermal energy stored in the component to be temperature-controlled is utilized for another component.

17. The method according to claim 7, comprising, in a third state, fluidically connecting by the connecting valve the main circuit first conduit portion and the main circuit second conduit portion to the partial circuit via the first fluid connection to produce a mixture of the fluid from the main circuit and the partial circuit.

18. The method according to claim 7, wherein, in the partial circuit, at least one temperature sensor is arranged in front of the component to be temperature-controlled and at least one further temperature sensor is arranged behind the component to be temperature-controlled.

19. The method according to claim 7, wherein the partial circuit second conduit portion comprises a throttle.

20. The method according to claim 7, wherein, in the main circuit first conduit portion, a third temperature sensor is provided behind the heat exchanger.

* * * * *